E. H. COLPITTS.
SYSTEM FOR THE TRANSMISSION OF INTELLIGENCE.
APPLICATION FILED APR. 9, 1917.
Reissued Oct. 23, 1917.
14,380.
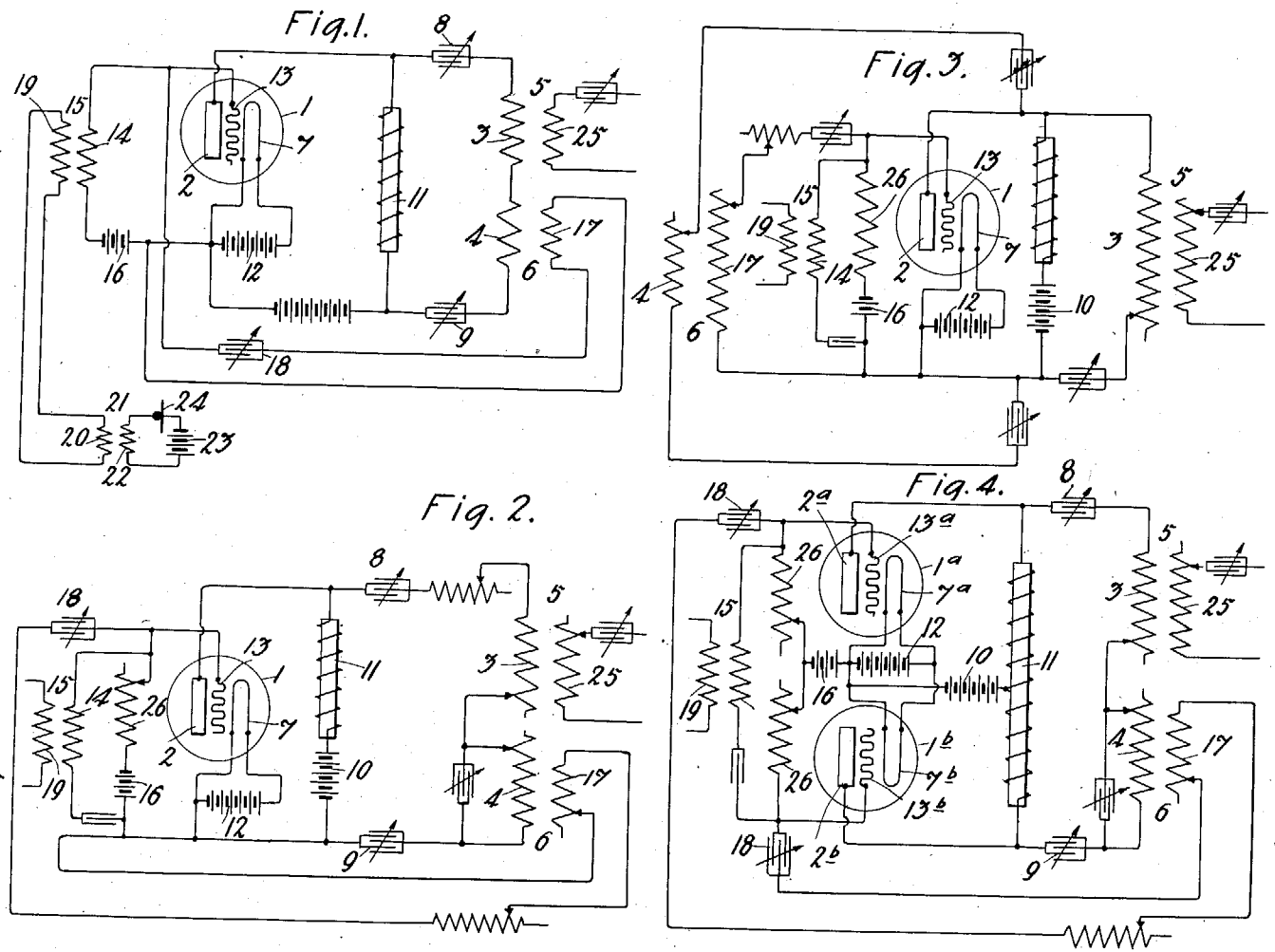
Inventor:
Edwin H. Colpitts.
by J. G. Roberts
Att'y.

UNITED STATES PATENT OFFICE.

EDWIN H. COLPITTS, OF EAST ORANGE, NEW JERSEY, ASSIGNOR, BY MESNE ASSIGNMENTS, TO AMERICAN TELEPHONE & TELEGRAPH COMPANY, A CORPORATION OF NEW YORK.

SYSTEM FOR THE TRANSMISSION OF INTELLIGENCE.

14,380. Specification of Reissued Letters Patent. Reissued Oct. 23, 1917.

Original No. 1,137,384, dated April 27, 1915, Serial No. 839,318, filed May 18, 1914. Application for reissue filed April 9, 1917. Serial No. 160,871.

*To all whom it may concern:*

Be it known that I, EDWIN H. COLPITTS, a subject of the King of Great Britain, residing at East Orange, in the county of Essex and State of New Jersey, have invented certain new and useful Improvements in Systems for the Transmission of Intelligence.

This invention relates to systems for the transmission of intelligence, in which the amplitudes of successive electrical oscillations of high frequency are varied in accordance with the lower frequency forms of the messages delivered.

Its object is to simplify the mechanism and to strengthen the effectiveness of the apparatus required for the production of the modulated oscillations.

To these ends the invention embodies a repeater which serves not only as a generator of high frequency oscillations, but also as a means for modulating the oscillations in accordance with the low frequency signaling impulses to be transmitted.

The invention is adapted for embodiment in systems of wireless telegraphy and telephony in so-called high frequency wired systems, and in general wherever a receiving device is rendered sensitive to signaling impulses or waves of low frequencies by means of sustained electric or electromagnetic waves of high frequency transmitted from the sending station.

The single device used to perform the two functions referred to may be a repeater, preferably a repeater of the audion type, wherein the output circuit is connected with the input circuit, this arrangement, with proper adjustment of devices in the circuit, resulting in the production of sustained high frequency oscillations. By varying the potential in the input circuit, as for example by connecting a transmitter or other device for sending a message in circuit with one of the electrodes, say the grid, of the audion, the sustained oscillations, it has been found, are then modulated in accordance with the message to be sent. The message may be received or recorded in any desired manner at the distant station.

Several embodiments of the invention will be set forth in the following detail description taken in connection with the accompanying drawings, wherein—

Figure 1 illustrates a system of circuits embodying the invention; and Figs. 2, 3 and 4 are modified circuits therefor.

Like parts are designated alike in the several figures.

Referring first to Fig. 1, an audion 1, the elements of which are inclosed in an evacuated vessel, as usual, is arranged with its output anode or plate 2 connected through the primary windings 3 and 4 of repeating coils 5 and 6 to the negative terminal of the heated filament or cathode 7 of the audion. Included in this output circuit may be located a battery 10 and, as required, adjustable devices such as the condensers 8 and 9. Bridged across the circuit, to feed battery current to the plate 2, is a coil of high impedance 11. The filament 7 is heated by current from the battery 12. The input electrode or grid 13 of the audion is connected through the secondary winding 14 of a repeating coil 15 to the negative terminal of the filament 7, and included in this, the input circuit, there may be located a battery 16. The secondary winding 17 of the repeating coil 6 is connected through an adjustable condenser 18 with the input circuit, one wire leading to the grid 13 and the other wire to the negative terminal of the filament 7.

The primary winding 19 of the repeating coil 15 may be connected in circuit with the secondary winding 20 of another repeating coil 21, the primary winding 22 of which is connected in circuit with a battery 23 and a sending device, which, as shown, may be a telephone transmitter 24. The repeating coil 5 has a secondary winding 25, the terminals of which lead to the antenna of a wireless system or to the line of a wire circuit, according to the particular use to which the apparatus is put.

The operation of the system illustrated in Fig. 1 is as follows: The audion 1 is rendered active by the heated filament 7, which emits a stream of negative ions across the space intervening between it and the positively charged plate 2. This stream passses through the interspaces of the grid. The battery 10, acting through the resistance of the coil 11, tends to maintain a steady flow of current in the output circuit, including the ionized space between the plate 2 and the filament 7. The flow of current across the ionized space, however, is not steady but is caused to fluctuate at a very high frequency, by reason of the interaction between the input and output circuits through the repeating coil 6. The frequency of the sustained oscillations produced by this arrangement may be varied by adjusting the capacities of the various condensers in the circuit. The high frequency currents in the output circuit are transmitted by the repeating coil 5 into the line or antenna to which the secondary winding 25 may be connected.

By means of the telephone transmitter 24, the amplitude of the sustained oscillations is modified or modulated in accordance with sound waves which are of a lower order of frequency. This may be explained as follows: At the normal potential of the battery 16 impressed on the grid 13, the sustained oscillations are produced at a constant amplitude. At a higher potential, due to a positive impulse from the winding 14, the current in the output circuit is increased, and the amplitude of the high frequency oscillations is greater. Conversely, at a lower potential, due to a negative impulse, the oscillations become lesser in amplitude than normal. Thus each pulsation of potential, caused by speaking into the transmitter 24, is effective in producing a corresponding variation in the amplitude of oscillations of current, and therefore of energy in the output circuit and likewise in the line or antenna.

In Fig. 2 is shown an arrangement differing from that of Fig. 1 in that the battery 10 thereof, corresponding to the like numbered battery in Fig. 1, is connected in series with the high impedance coil 11 in bridge of the output circuit. The arrangement is also different in that the battery 16 is included in a bridge of the input circuit in series with an adjustable resistance 26.

In Fig. 3 is illustrated a modified circuit in which the battery 10 is included in series with the high impedance coil 11 as it is in Fig. 2, but primary windings 3 and 4 of the repeating coils 5 and 6 are connected in parallel with relation to each other instead of in series as in Figs. 1 and 2.

In Fig. 4 an arrangement is shown in which two audions $1^a$ and $1^b$ are used. Here the battery 10 is connected to a central point in the winding of the high impedance coil 11, the outer terminals of which are connected to the two plates $2^a$ and $2^b$, respectively, of the two audions. Battery 16 is likewise connected to a midpoint of an adjustable resistance 26, the outer terminals of which are connected to the two grids $13^a$ and $13^b$. In the system of Fig. 4, therefore, the battery 10 tends to supply a steady flow of current through both audions from the plates $2^a$ and $2^b$ to the two filaments $7^a$ and $7^b$, respectively. The battery 12 supplies current to both of the filaments $7^a$ and $7^b$. The operation is such that the impulses from the repeating coils 6 and 15 produce at any instant of time opposite potential variations on the grids $13^a$ and $13^b$, and these opposite potential variations produce an effect which is cumulative in the output circuit to which the plates $2^a$ and $2^b$ are connected.

What is claimed is:

1. The combination with a vacuum tube having a filament, a plate and a grid, an input circuit connected with the grid and an output circuit connected with the plate; of means for impressing sustained high frequency oscillations on said input circuit; and a source of low frequency potential variations connected to said input circuit, said output circuit comprising means for supplying modulated high frequency oscillations.

2. The combination with a vacuum tube having a filament, a plate and a grid, an input circuit connected with the grid and an output circuit connected with the plate; of means for impressing sustained high frequency oscillations on said input circuit, and signaling means associated with said tube, said output circuit comprising means for supplying high frequency oscillations modulated in accordance with the signal.

3. The combination with a generator of high frequency oscillations, comprising a repeater of the feed-back type and an input and an output circuit connected to each other to produce sustained high-frequency oscillations, of means for modulating said high frequency oscillations in accordance with low frequency signaling impulses.

4. The combination with a generator of high frequency oscillations, comprising a vacuum tube repeater of the audion type and input and an output circuit therefor arranged to react upon each other to produce sustained high-frequency oscillations, of means for modulating said high frequency oscillations in accordance with low frequency signaling impulses, and a transmission circuit for receiving the modulated high frequency oscillations.

5. The combination with a generator of high frequency oscillations, comprising a repeater having an input and an output circuit connected with each other for producing sustained high-frequency oscillations, of a source of low frequency potential variations, and circuit connections by which said low frequency potential variations vary the amplitude of said high frequency oscillations.

6. The combination of a vacuum tube repeater of the audion type adapted to generate sustained high frequency oscillations, with means for modulating said oscillations in accordance with a telephone signal to be transmitted, and means for transmitting the modulated high frequency oscillations so produced.

7. In a system for signaling by high frequency oscillations, a thermionic device of the audion type for modulating high frequency oscillations in accordance with low frequency signals, said device having an input and an output circuit, said input circuit comprising a heated filament and a controlling electrode, means for generating low frequency signals, and means for impressing said low frequency signals upon the input circuit of said device.

8. In a system for signaling by high frequency oscillations, a thermionic device for modulating said high frequency oscillations in accordance with low frequency signals, said device comprising an evacuated vessel containing a filament, an auxiliary electrode and a plate element, and means for changing the potential of the auxiliary electrode with respect to the filament in accordance with low frequency signals to be transmitted.

9. In a system for signaling by high frequency oscillations, a thermionic device for modulating said high frequency oscillations in accordance with low frequency signals, said device comprising an evacuated vessel containing a filament, an auxiliary electrode and a plate element, means for generating low frequency signals, and means for impressing said signals between the filament and the auxiliary electrode.

10. In a system for signaling by high frequency oscillations, a thermionic device for modulating said high frequency oscillations in accordance with low frequency signals, said device comprising an evacuated vessel containing a filament, a grid and a plate element, means for generating low frequency signals, and means for simultaneously impressing on said grid the high frequency oscillations and the low frequency signaling impulses.

11. A signaling system comprising an audion having filament, grid and plate electrodes, means for supplying high frequency oscillations to said audion, signaling means associated with said audion, and a circuit connected to said plate and said filament electrodes for leading off from said audion high frequency oscillations modulated in accordance with said signal.

12. A signaling system comprising an audion having filament, grid and plate electrodes, means for supplying high frequency oscillations, means for supplying signaling oscillations, means comprising said audion for modulating said high frequency oscillations in accordance with said signaling oscillations, and a circuit connected to said filament and plate electrodes for leading off the modulated oscillations from said audion.

13. The combination with a generator of high frequency current, comprising a repeater and an input and an output circuit therefor united with each other, said repeater having an electrode located in said input circuit; of a transmission line united with said output circuit, and a source of low frequency potential variations connected to said electrode.

14. The combination with an audion having a filament, a plate and a grid, an input circuit connected with the grid and an output circuit connected with the plate; of an inductive connection between said output and said input circuits adapted to the production by said audion of sustained high frequency oscillations, and a sending device, adapted for producing signaling impulses of low frequencies, connected with said input circuit.

15. The combination with a generator of high frequency current, comprising a repeater, an input and an output circuit therefor and a connection between said circuits; of a transmission line united with said output circuit, and a sending device, adapted for producing signaling impulses of low frequencies, connected with said input circuit.

16. The combination with a generator of high frequency current, comprising an evacuated vessel, means for producing a state of ionization in said vessel, and an input and an output circuit interconnected to react upon each other; of means connected with said input circuit for producing low frequency potential variations in said input circuit.

17. The combination with a generator of high frequency current, comprising an evacuated vessel, means for producing a state of ionization in said vessel, and an input and an output circuit inductively connected with each other; of a source of low frequency potential variations connected with said input circuit for controlling the amplitude of the high frequency currents developed by said generator.

18. The combination with a generator of high frequency current, comprising an evacuated vessel, means for producing a state of ionization in said vessel, and an input and an output circuit connected with each other; of means included in said circuits for adjusting the frequency of said current; and a source of low frequency potential variations connected with said input circuit for controlling the amplitude of the high frequency currents developed by said generator.

19. In apparatus of the kind described, the combination of an evacuated vessel and means, including a cathode, for producing a state of ionization in said vessel; of an input anode and an output anode in said vessel; an output circuit connected to said output anode and including an adjustable condenser and a source of continuous current, an input circuit connected to said input anode and inductively connected to said output circuit, and means connected with said input circuit for producing low frequency potential variations in said input circuit.

20. The combination with an audion having an input circuit and an output circuit inductively connected with each other; of means connected with said input circuit for producing low frequency potential variations in said input circuit.

In witness whereof, I hereunto subscribe my name this 12th day of March, 1917.

EDWIN H. COLPITTS.